(12) United States Patent
Ichikawa et al.

(10) Patent No.: US 6,342,791 B1
(45) Date of Patent: Jan. 29, 2002

(54) DIODE DEFECT DETECTING DEVICE

(75) Inventors: Kinya Ichikawa; Koichiro Kurata, both of Shiga-ken; Suteo Fujino, Yokaichi; Chihiro Okado, Fuchu; Takatomo Izume, Urawa; Yasuo Sakata, Kobe, all of (JP)

(73) Assignees: Nas-Toa Co., Ltd., Tokyo; Kabushiki Kaisha Toshiba, Kawasaki, both of (JP)

( * ) Notice: Subject to any disclaimer, the term of this patent is extended or adjusted under 35 U.S.C. 154(b) by 0 days.

(21) Appl. No.: 09/501,243

(22) Filed: Feb. 10, 2000

(30) Foreign Application Priority Data

Feb. 10, 1999 (JP) .......................................... 11-033195

(51) Int. Cl.$^7$ ............................................. G01R 31/26
(52) U.S. Cl. ...................................................... 324/767
(58) Field of Search ................................ 324/767, 765; 323/224, 229; 327/172; 363/41

(56) References Cited

U.S. PATENT DOCUMENTS 5,497,095 A * 3/1996 Ueyama et al. ............. 324/767

* cited by examiner

*Primary Examiner*—Safet Metjahic
*Assistant Examiner*—James C Kerveros
(74) *Attorney, Agent, or Firm*—Oblon, Spivak, McClelland, Maier & Neustadt, P.C.

(57) ABSTRACT

This invention is a diode defect detecting device including a current detector for detecting the primary current of a transformer, a comparator for comparing the detection current detected by the current detector with a current reference and outputting a reset signal if the detection current is larger than the current reference, an oscillator for generating a clock signal, a flip-flop circuit for receiving a set signal on the basis of a front and an end edge of the clock signal generated by the oscillator and receiving the output reset signal from the comparator, a polarity changing circuit for outputting a polarity changing signal for changing the polarities of the plurality of diodes on the basis of the output clock signal from the flip-flop circuit, and a determination circuit for calculating, in order to detect malfunctions of the plurality of diodes, any impedance change on the secondary side viewed from the primary side of the transformer on the basis of the pulse width of each polarity of the output clock signal from the flip-flop circuit.

9 Claims, 6 Drawing Sheets

DIODE DEFECT DETECTING DEVICE

CROSS-REFERENCE TO RELATED APPLICATION

This application is based upon and claims the benefit of priority from the prior Japanese Patent Application No. 11-033195, filed Feb. 10, 1999, the entire contents of which are incorporated herein by reference.

BACKGROUND OF THE INVENTION

The present invention relates to a diode defect detecting device of a DC load supply apparatus used in, e.g., an inverter type resistance welding machine.

FIG. 1 shows an example of a controller of a conventional inverter type resistance welding machine.

An inverter circuit in which IGBT switching elements 2, 3, 4, and 5 are bridge-connected is connected in parallel with a DC power supply 1, thereby converting a direct current into an alternate current. This alternate current is supplied to the primary side of a transformer 7.

A load resistance 11 is connected to the secondary side of the transformer 7. An alternate current on this secondary side is rectified into a direct current by a rectifying circuit in which a plurality of diodes 8 and 9 are connected in a center tap manner. This direct current is supplied to the load resistance 11.

A current sensor 6 senses the primary current of the transformer 7. A current detector 15 detects this current after converting it into a direct current. An overcurrent detector 16 detects an inverter output overcurrent from the output from the current sensor 6.

The diodes 8 and 9 convert the secondary alternate current of the transformer 7 into a direct current and supplies the current to the load resistance 11 via a wiring inductance 10. This wiring inductance 10 is not particularly formed; it represents the inductance present in wiring.

An output current reference value from a current reference unit (current reference circuit) 12 is input to an amplifier 14 when a start switch 13 is turned on. This amplifier 14 amplifies any deviation of the output from the current detector 15 from the output from the current reference unit 12. This amplified deviation and a triangular-wave frequency output from a triangular-wave generator 17 are input to a PWM circuit 18. On the basis of these outputs from the amplifier 14 and the triangular-wave generator 17, the PWM circuit 18 outputs a PWM signal. This PWM signal is applied to the gates of the switching elements 2 to 5 via a polarity changing circuit 19 in order to switch the polarity of the inverter output.

As described above, when the diodes 8 and 9 are normal the current control is performed such that the peak value of the primary current of the transformer 7 corresponds to the current reference.

FIG. 2 is a timing chart for explaining an operation when only the diode 8 is shorted in FIG. 1. At time $t_1$, the start switch 13 is turned on to apply an inverter output voltage $V_1$ having pulse widths $t_1$ and $t_2$ to the primary side of the transformer 7.

Consequently, on the secondary side of the transformer 7 a transformer primary current $I_1$ rises in a circuit of diode 8 (shorted)→wiring inductance 10→load resistance 11. When the inverter output voltage $V_1$ is shut off at time $t_2$, the transformer primary current $I_1$ becomes zero.

Next, the inverter output voltage $V_1$ is inverted at time $t_3$. Since the transformer secondary side is shorted by a circuit of diode 9→diode 8 (shorted), the transformer primary current $I_1$ rapidly rises. At time $t_4$ at which this transformer primary current $I_1$ reaches the detection level of the overcurrent detector 16, the overcurrent detector 16 detects an overcurrent, and the inverter stops operating.

If the pulse width of the inverter output voltage is smaller than the interval between $t_3$ and $t_4$, the inverter sometimes keeps operating because the overcurrent level is not reached.

The conditions are affected by the magnitude of the current reference or the response (generally, PI control is used) speed of the amplifier 14.

As described above, when the diodes 8 and 9 are short-circuited in the controller of the conventional inverter type resistance welding machine, depending on the conditions the overcurrent detector 16 can detect an overcurrent or the overcurrent detection level is not reached. This makes the detection unstable. At the same time, the inverter operates at a current slightly lower than the overcurrent detection level. This applies stress on the switching elements 2 to 5 constructing the inverter and may degrade the reliability of the inverter. Furthermore, where the diodes are shorted, a normal current can not flow into a welding object, thus a problem arises that defective items flows to following process.

BRIEF SUMMARY OF THE INVENTION

It is an object of the present invention to provide a diode defect detecting device capable of reliably detecting defects of diodes without applying the stress to switching elements of an inverter, thereby improving reliability of the device and detecting a defect of the diode at an earliest stage.

To achieve this object, according to the first aspect of the present invention, there is provided a diode defect detecting device used in a controller in which an inverter converts a direct current into an alternate current and supplies the alternate current to a primary side of a transformer, and a rectifying circuit having a plurality of diodes connected to a secondary side of the transformer rectifies an alternate current induced on the secondary side into a direct current and supplies the direct current to a load, comprising:

a current detector for detecting a primary current of the transformer;

a comparator for comparing the detection current detected by the current detector with a current reference and outputting a reset signal if the detection current is larger than the current reference;

an oscillator for generating a clock signal;

a flip-flop circuit for receiving a set signal on the basis of a front and an end edge of the clock signal generated by the oscillator and receiving the output reset signal from the comparator;

a polarity changing circuit for outputting a polarity changing signal for changing polarities of the plurality of diodes on the basis of the output clock signal from the flip-flop circuit; and a determination circuit for calculating, in order to detect malfunctions of the plurality of diodes, an impedance change on the secondary side viewed from the primary side of the transformer on the basis of a pulse width of each polarity of the output clock signal from the flip-flop circuit.

According to the second aspect of the present invention, there is provided a diode defect detecting device of the first aspect, wherein the determination circuit calculates the impedance change by using a modulation factor of the pulse width of each polarity and a peak value of the primary current detected by the current detector, thereby detecting a diode malfunction.

According to the third aspect of the present invention, there is provided a diode defect detecting device of the first aspect, wherein the determination circuit calculates the impedance change by using a modulation factor of the pulse width of each polarity and the current reference, thereby detecting a diode malfunction.

According to the fourth aspect of the present invention, there is provided a diode defect detecting device of the first aspect, wherein the determination circuit detects a diode malfunction when the modulation factor of the pulse width of each polarity becomes equal to or smaller than a predetermined value.

According to the fifth aspect of the present invention, there is provided a diode defect detecting device of the first aspect, wherein the determination circuit obtains a pulse width of each polarity during a few cycles after the inverter is started.

According to the sixth aspect of the present invention, there is provided a diode defect detecting device of the first aspect, wherein the determination circuit detects a diode malfunction if a value obtained by dividing a pulse width of one polarity by a pulse width of the other polarity is larger than a predetermined value.

According to the seventh aspect of the present invention, there is provided a diode defect detecting device of the first aspect, further comprising:

an alarm generating circuit for generating alarm when the determination circuit detects a diode malfunction.

According to the eighth aspect of the present invention, there is provided a diode defect detecting device of the first aspect, wherein the pulse width of each polarity is obtained by counting the pulse width of each polarity of the output clock signal from the flip-flop circuit by using a counter.

According to the ninth aspect of the present invention, there is provided a diode defect detecting device used in a controller in which an inverter converts a direct current into an alternate current and supplies the alternate current to a primary side of a transformer, and a rectifying circuit having a plurality of diodes connected to a secondary side of the transformer rectifies an alternate current induced on the secondary side into a direct current and supplies the direct current to a load, comprising:

a current detector for detecting a primary current of the transformer;

a comparator for comparing the detection current detected by the current detector with a current reference and outputting a reset signal if the detection current is larger than the current reference;

an oscillator for generating a clock signal;

a flip-flop circuit for receiving a set signal on the basis of a front and an end edge of the clock signal generated by the oscillator and receiving the output reset signal from the comparator;

a polarity changing circuit for outputting a polarity changing signal for changing polarities of the plurality of diodes on the basis of the output clock signal from the flip-flop circuit;

a current change rate detector for detecting a change rate of the primary current of the transformer;

a first latch circuit for latching the current change rate detected by the current change rate detector at an input timing of an end edge of a positive side clock signal of the clock signal of each polarity output from the flip-flop circuit;

a second latch circuit for latching the current change rate detected by the current change rate detector at an input timing of an end edge of a negative side clock signal of the clock signal of each polarity output from the flip-flop circuit; and a circuit for detecting malfunctions of the plurality of diodes if a difference between the current change rates latched by the first and second latch circuits is equal to or larger than a predetermined value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

<First Embodiment>

Figure 1:
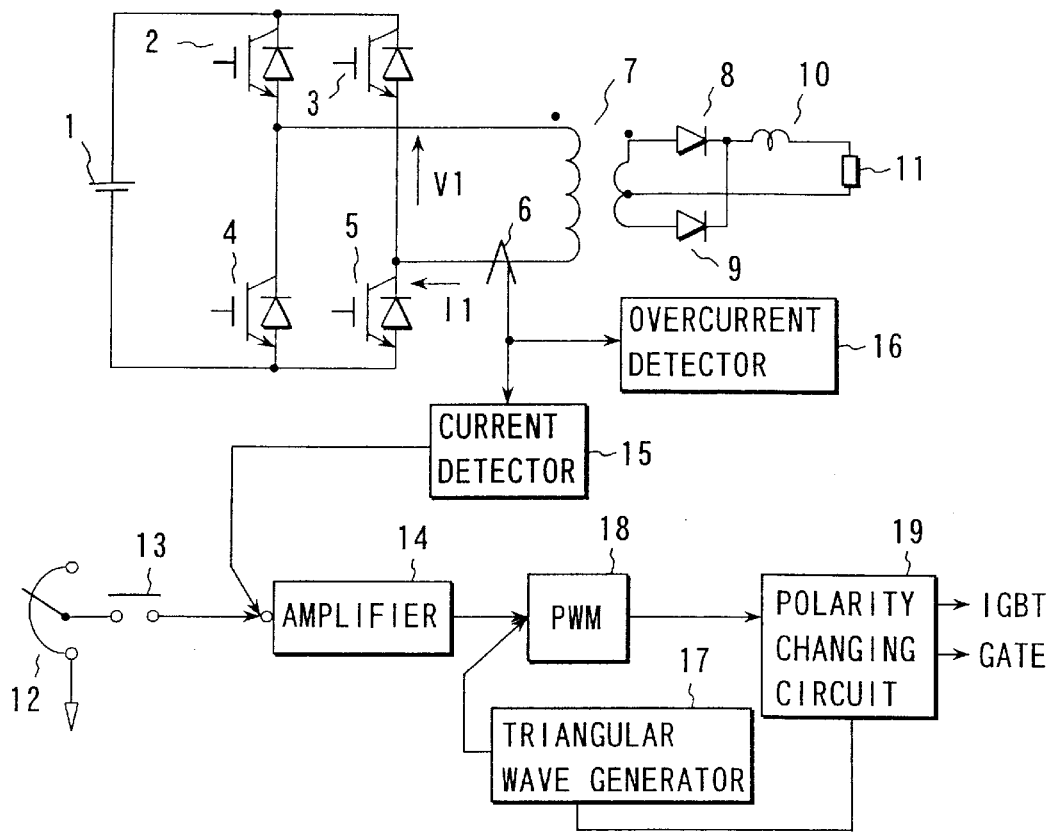
FIG. 1 is a schematic view showing a controller of a conventional inverter type resistance welding machine.
Figure 2:
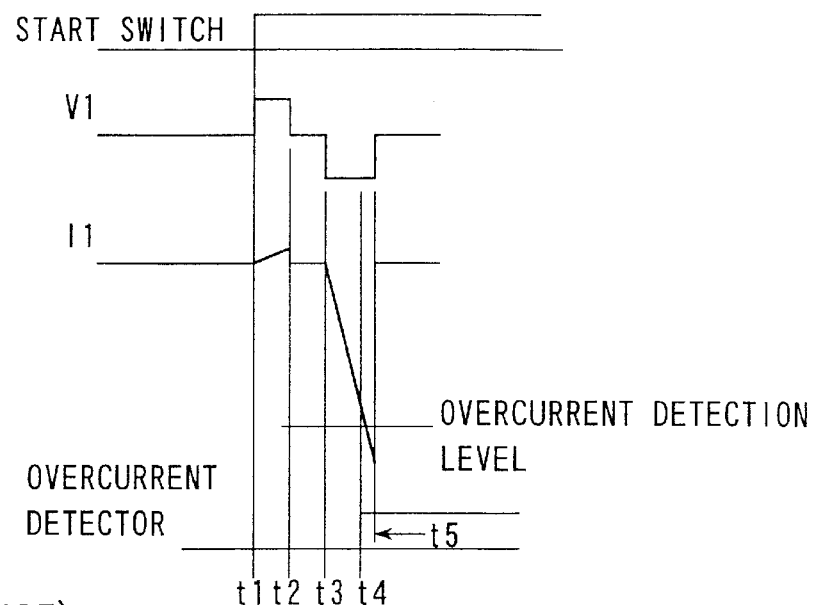
FIG. 2 is a view for explaining the operation of the controller shown in FIG. 1.
Figure 3:
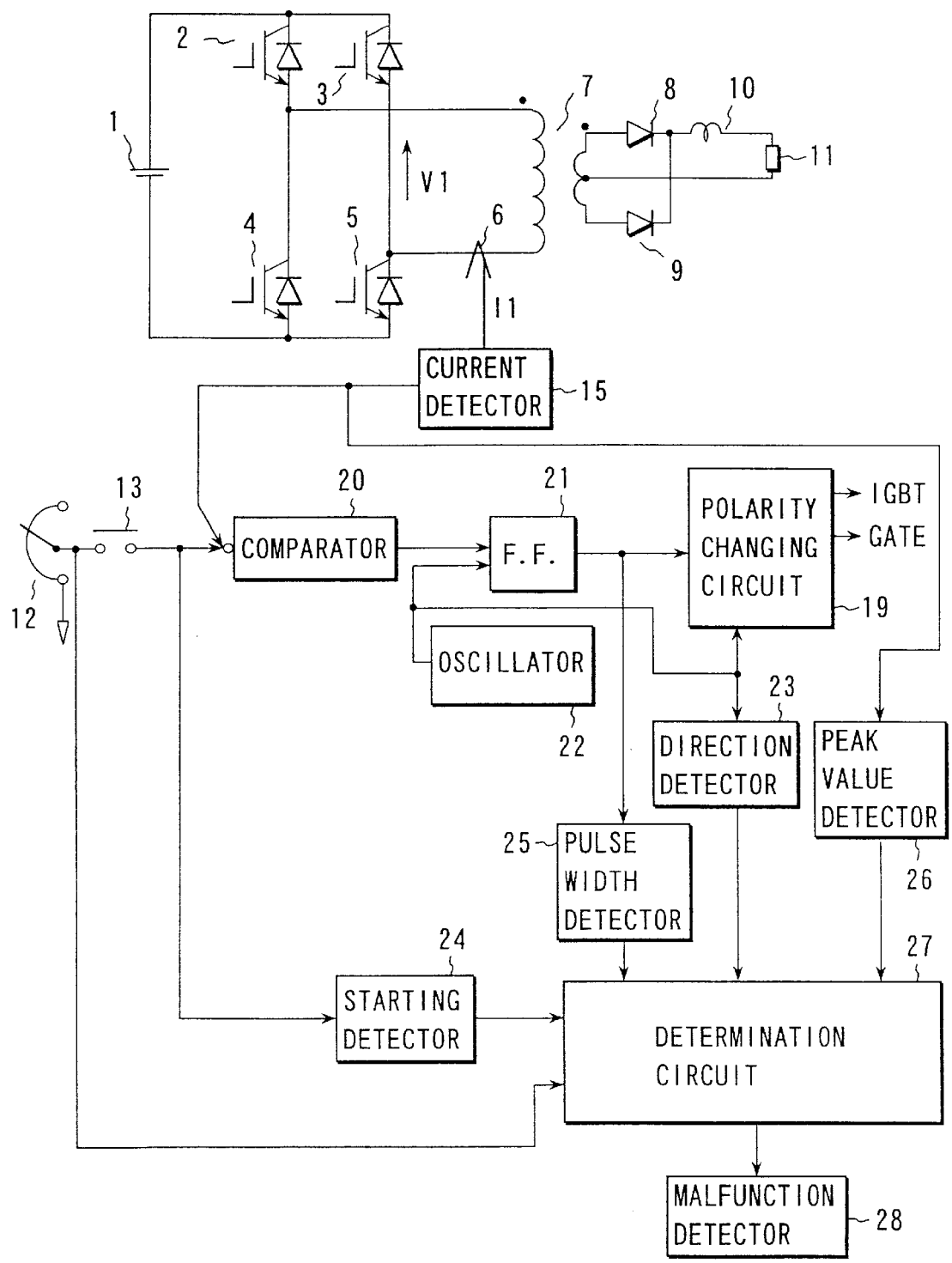
FIG. 3 is a schematic view showing a diode defect detecting device according to the first embodiment of the present invention.

FIG. 3 is a schematic view showing a diode defect detecting device according to the first embodiment of the present invention. The same reference numerals as in FIG. 1 denote the same parts in FIG. 3, and a detailed description thereof will be omitted. In this embodiment, differences will be primarily described.

A DC voltage from a DC power supply 1 is converted into an alternate current by PWM control by an inverter bridge including switching elements 2 to 5. This converted alternate current is supplied to the primary side of a transformer 7. A center tap type rectifying circuit composed of diodes 8 and 9 rectifies a secondary alternate voltage and supplies the voltage to a load resistance 11.

A section for detecting the instantaneous value of a primary current $I_1$ of the transformer 7 comprises a current sensor 6 composed of a current transformer, and a current detector 15 for converting an AC detection value detected by this current sensor 6 into a direct current.

The diode defect detecting device of this embodiment also includes a comparator 20 and an F.F. 21. The comparator 20 compares a current reference from a current reference unit 12 with an output DC detection value from the current detector 15. If the DC detection value is larger than the current reference, the comparator 20 outputs a reset signal. The F.F. 21 receives a clock signal from an oscillator 22. The F.F. 21 also receives the reset signal and outputs inverter PWM pulses, i.e., a positive side pulse $P_F$ and a negative side pulse $P_R$ shown in FIGS. 4A to 6B. This F.F. 21 is set by the front and end edges of the output clock signal from the oscillator 22. For example, the positive side pulse $P_F$ is generated by the front edge of the clock signal, and the negative side pulse $P_R$ is generated by the end edge.

A pulse width detector 25 detects the pulse widths of the PWM pulses from the F.F. 21. This pulse width detector 25 is composed of, e.g., a counter circuit and outputs signals corresponding to the widths of the pulses $P_F$ and $P_R$ having the respective polarities output from the F.F. 21 to the determination circuit 27. The determination circuit 27 detects a diode defect on the basis of the current detection value from the current detector 15. More specifically, this determination circuit 27 receives the current reference from the current reference unit 12, a start signal from a starting detector 24, the signals corresponding to the widths of the pulses $P_F$ and $P_R$ from the pulse width detector 25, the peak value of a current detection value detected by a peak value detector 26, and an inverter output polarity from a direction detector 23. On the basis of these inputs, the determination circuit 27 detects malfunctions of the diodes 8 and 9.

This diode defect detecting device further includes a malfunction detector 28 on the output side of the determination circuit 27. When the determination circuit 27 detects a malfunction of the diode 8 or 9, the malfunction detector 28 generates alarm or stops the operation. More specifically, this malfunction detector 28 generates alarm when the determination circuit 27 detects a diode defect. If diode defects are successively detected, the malfunction detector 28 stops the operation of the inverter.

A start switch 13 which when the inverter is to be started is closed to receive the current reference from the current reference unit 12 is provided on the input side of the comparator 20. The starting detector 24 outputs the start signal when the start switch 13 is closed.

A polarity changing circuit 19 changes the polarity of the PWM pulse from the F.F. 21 in accordance with the output signal from the oscillator 22, and applies the pulse to the IGBT gates of the switching elements 2 to 5.

The comparator 20 compares the current reference with the primary current $I_1$ of the transformer 7 detected by the current detector 15. If the current detection value is larger than the current reference, the comparator 20 outputs the reset signal to reset the F.F. 21.

On the basis of the clock frequency generated by the oscillator 22, the F.F. 21 is reset. Consequently, the polarity changing circuit 19 outputs a signal for turning on the switching elements 2 to 5 of the inverter bridge. Also, the F.F. 21 is reset by the reset signal from the comparator 20. As a consequence, the polarity changing circuit 19 outputs a signal for turning off the switching elements 2 to 5.

The direction detector 23 detects the polarity of the inverter output from the output from the oscillator 22. The peak value detector 26 detects the peak value from the output from the current detector 15, i.e., from the DC current detection value.

Figure 4A:
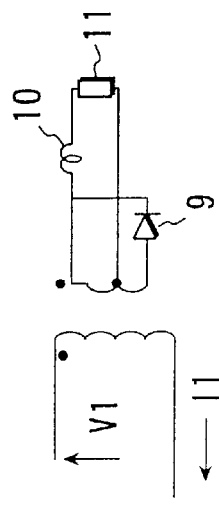
FIG. 4A is a view showing a transformer and a load resistance where one diode 8 of diodes 8 and 9 shown in FIG. 3 is shorted.
Figure 4B:
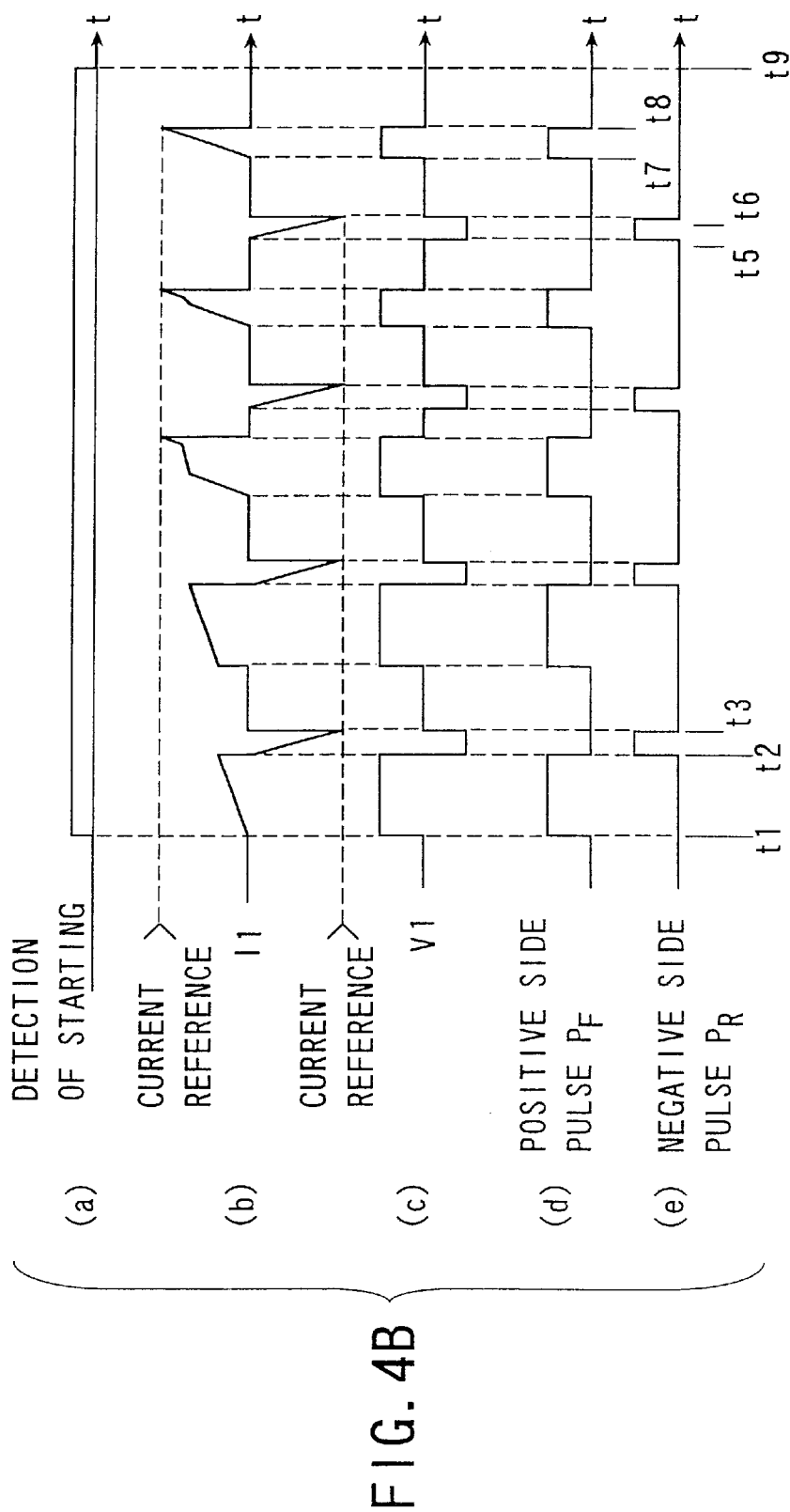
FIG. 4B is a view for explaining the operation of the diode defect detecting device shown in FIG. 3 where one diode 8 of diodes 8 and 9 is shorted.

Operations of this diode defect detecting device shown in FIG. 3 constructed as above will be described below with reference to FIGS. 4A to 8. FIGS. 4A and 4B are views for explaining operation when the diode 8 is shorted. FIG. 4A shows the transformer 7 and the load resistance 11. FIG. 4B is a view for explaining the operation where the diode 8 is shorted. In FIG. 4B, (a) indicates the operation of the start switch 13,
(b); the waveform of the transformer primary current $I_1$
(c); the waveform of the inverter output voltage $V_1$,
(d); the waveform of the positive side pulse $P_F$, and
(e); the waveform of the negative side pulse $P_R$.

In a resistance welding machine, flat pressure-welding structures are used as the diodes 8 and 9. Hence, a short-circuit is a likely diode malfunction.

At time $t_1$, the start switch 13 is turned on to input the current reference (having the magnitude indicated by the broken line). The inverter starts to apply a high-frequency voltage (generally, a few kHz or less) as indicated by the inverter output voltage $V_1$ to the transformer 7. The switching elements 2 to 5 are kept ON until the transformer primary current $I_1$ reaches the current reference.

During the period from time $t_1$ to time $t_2$, on the transformer secondary side a voltage is generated in a direction indicated by the dot marks. A current flows through a circuit of wiring inductance 10→load resistance 11.

When the inverter output voltage $V_1$ is inverted at time $t_2$, a voltage is generated in a direction in which the dot marks are negative. Therefore, the transformer 7 is shorted via the diode 9.

The transformer primary current $I_1$ rapidly rises and reaches the current reference at time $t_3$, at which the F.F. 21 is reset and the switching elements are turned off. Thus the positive side pulse $P_F$ widens and the negative side pulse $P_R$ narrows. Accordingly, the transformer 7 becomes magentically asymmetrical and gradually saturates.

This gradually increases the speed at which the positive side of the transformer primary current $I_1$ rises. Immediately before the completion of welding, both time intervals between times $t_7$ and $t_8$ of the positive side pulse $P_F$ and between times $t_5$ and $t_6$ of the negative side pulse $P_R$ are narrow. However, the relation $t_7$ to $t_8$>$t_5$ to $t_6$ holds because the load impedance is asymmetrical.

FIGS. 5A to 7B are views for explaining another malfunction mode different from the aforementioned malfunction of the diodes 8 and 9.

Figure 5A:
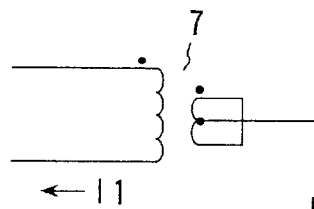
FIG. 5A is a view showing the transformer and the load resistance where both of the diodes 8 and 9 shown in FIG. 3 are shorted.
Figure 5B:
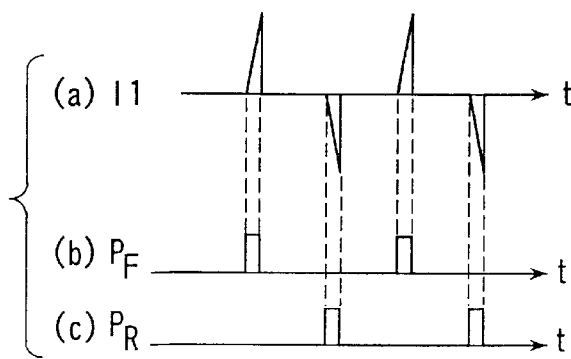
FIG. 5B is a view for explaining the operation of the diode defect detecting device shown in FIG. 3 where both of the diodes 8 and 9 are shorted.

FIGS. 5A and 5B indicate a case where both the diodes 8 and 9 are shorted. FIG. 5A shows the transformer 7 and the load resistance 11. In FIG. 5B, (a) indicates the waveform of the transformer primary current $I_1$, (b); the waveform of the positive side pulse $P_F$, and (c); the waveform of the negative side pulse $P_R$.

As is apparent from (b) and (c) shown in FIG. 5B, when both the diodes 8 and 9 are shorted the pulses $P_F$ and $P_R$ are equal but their pulse width is very narrow compared to the current $I_1$.

Figure 6A:
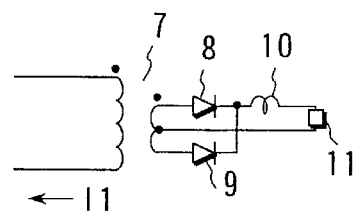
FIG. 6A is a view showing the transformer and the load resistance where both of the diodes 8 and 9 shown in FIG. 3 are normal.
Figure 6B:
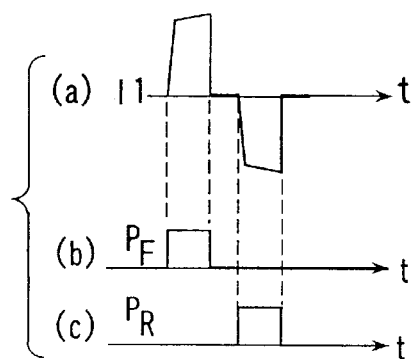
FIG. 6B is a view for explaining the operation of the diode defect detecting device shown in FIG. 3 where both of the diodes 8 and 9 are normal.

FIGS. 6A and 6B indicate a case where both the diodes 8 and 9 are normal. FIG. 6A shows the transformer 7 and the load resistance 11. In FIG. 6B, (a) shows the waveform of the transformer primary current $I_1$, (b);the waveform of the positive side pulse $P_F$, and (c); the waveform of the negative side pulse $P_R$.

As shown in (b) and (c) in FIG. 6B, when both the diodes 8 and 9 are normal the pulses $P_F$ and $P_R$ are equal and their pulse width is large.

Figure 7A:
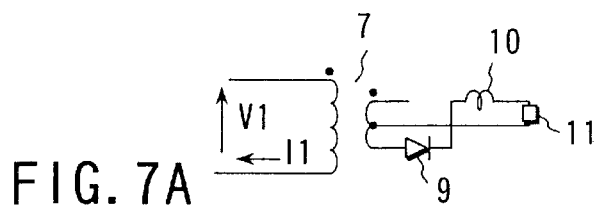
FIG. 7A is a view showing the transformer and the load resistance where one diode 8 of the diodes 8 and 9 shown in FIG. 3 is open.
Figure 7B:
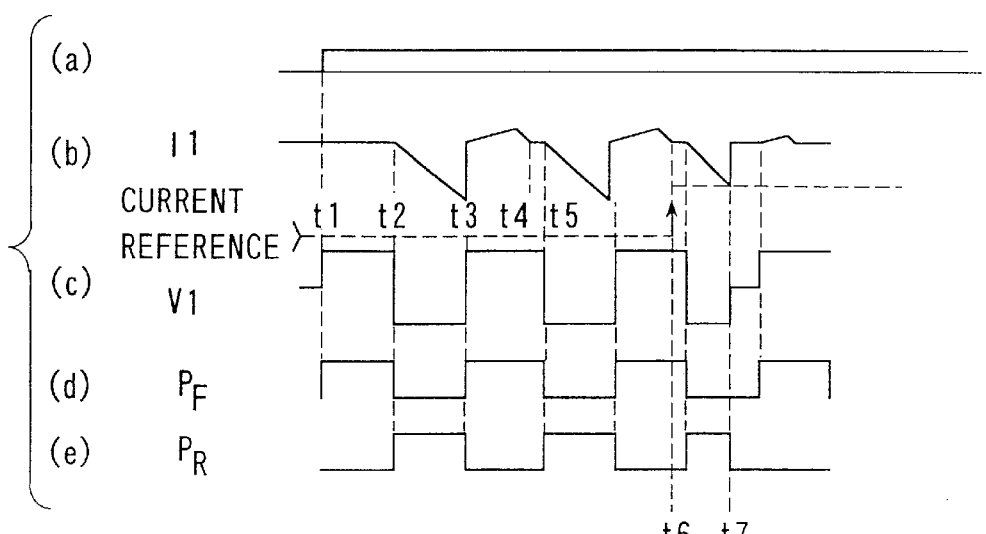
FIG. 7B is a view for explaining the operation of the diode defect detecting device shown in FIG. 3 where one diode 8 of the diodes 8 and 9 shown in FIG. 3 is open.

FIGS. 7A and 7B are views for explaining an operation when the diode 8 is open. FIG. 7A shows the transformer 7 and the load resistance 11 in this case. In FIG. 7B, (a) indicates a view for explaining the operation of the start switch 13, (b); the waveform of the transformer primary current $I_1$, (c); the waveform of the inverter output voltage $V_1$, (d); the waveform of the positive side pulse $P_F$, and (e); the waveform of the negative side pulse $P_R$.

When the diode 8 is open as shown in FIGS. 7A and 7B and $V_1$ is positive, the diode 9 is reverse connected, so no current flows to the transformer secondary side. When $V_1$ is negative, a current flows through a circuit of diode 9→wiring inductance 10→load resistance 11.

When $V_1$ switches to positive at time $t_3$, the transformer secondary side generates a voltage having polarity indicated by the dot marks. Hence, the current $I_1$ increases in a direction in which the current flowing through the wiring inductance 10 reduces. When the current flowing through the wiring inductance 10 becomes zero at time $t_6$, the diode 9 is reversed, so the current $I_1$ does not flow any longer. In this interval, the polarity of the current $I_1$ is unbalanced.

When the current reference rises at time $t_6$, $I_1$ reaches the current reference at time $t_7$, and the negative side pulse $P_R$ narrows. However, no current flows in the positive side pulse $P_F$, so the pulse width increases. Consequently, the transformer 7 gradually saturates, a saturation current flows, and $P_F$ narrows.

Since the secondary load of the transformer 7 is asymmetrical, $P_F$ and $P_R$ are unequal. Therefore, diode malfunctions can be detected by detecting the pulse width unbalance.

Accordingly, in the cases as shown in FIGS. 5A to 7B the determination circuit 27 detects diode defects by methods described below.

(1) Short-circuits of the diodes 8 and 9 can be detected by comparing $P_F$ with $P_R$ and detecting whether the difference is equal to or larger than a set value.

Figure 8:
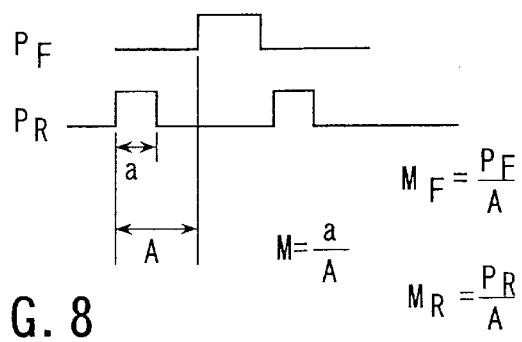
FIG. 8 is a view for explaining a modulation factor.

Note that to change the switching frequency of the inverter, a modulation factor M (a/A=the ratio of a current pulse width a to a maximum pulse width A) shown in FIG. 8 is used. Letting Vd denote the inverter DC voltage, the inverter output voltage is denoted by MVd.

The same effect is achieved by comparing a positive side pulse modulation factor $M_F$ (=$P_F$/A) with a negative side pulse modulation factor $M_R$ (=$P_R$/A), rather than by comparing the pulse widths. Furthermore, diode malfunctions can also be detected when the modulation factor of each polarity becomes equal to or smaller than a predetermined value.

(2) As shown in FIGS. 4A and 4B, the transformer 7 does not saturate immediately after starting. So, $P_F$ and $P_R$ have a very large pulse width difference, and this is advantageous in that the detection sensitivity increases. However, determination independent of the transient response of a current (the transient response of a pulse width) is necessary. Transition changes of pulse width are in a direction in which the pulse width decreases. When this is taken into consideration, FIG. 9 is obtained.

Figure 9:
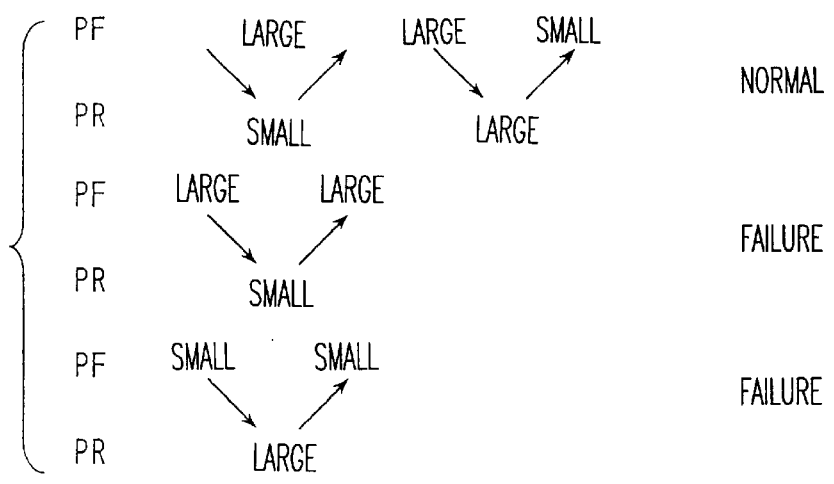
FIG. 9 is a view showing pulse width changes.

As shown in FIG. 9, the determination circuit 27 determines that the diodes are normal when $P_F$ and $P_R$ change in one direction and determines that a malfunction occurs if $P_F$ and $P_R$ change in both directions. For example, detection is possible in 1.5 pulse after starting.

(3) The pulses $P_F$ and $P_R$ immediately before the start signal is turned off are convenient in determination because their transitions are complete and they are stable.

Since the transformer secondary side is asymmetrical, the voltage applied to the transformer 7 is also asymmetrical, and the transformer 7 saturates by its DC component. Therefore, diode malfunctions can be detected by comparing $P_F$ with $P_R$ and detecting whether the ratio is equal to or larger than a set value.

Diode malfunctions can also be detected by calculating the load impedance by, e.g., $$(PF+PR) \div (I_1) \tag{1}$$

$$(MF+MR) \div (I_1) \tag{2}$$

$$PF/I_1 \tag{3}$$

$$PR/I_1 \tag{4}$$

$$MF/I_1 \tag{5}$$

$$MR/I_1 \tag{6}$$

and determining abnormality if the calculation result is equal to or smaller than a set value.

In FIGS. 5A and 5B, $P_F \approx P_R$. Diode malfunctions can be detected by calculating the load impedance by, e.g., $$(PF+PR) \div (I_1) \tag{7}$$

$$(MF+MR) \div (I_1) \tag{8}$$

$$PF/I_1 \tag{9}$$

$$PR/I_1 \tag{10}$$

$$MF/I_1 \tag{11}$$

$$MR/I_1 \tag{12}$$

and determining abnormality if the calculation result is equal to or smaller than a set value.

Note that the transformer primary current $I_1$ is so controlled as to be substantially consistent with the current reference. Hence, the action remains substantially the same even when $I_1 \rightarrow$current reference.

The determination circuit 27 can also detect diode defects when a value obtained by dividing the pulse width of the positive side pulse $P_F$ by the pulse width of the negative side pulse $P_R$ is larger than a predetermined value. Furthermore, the determination circuit 27 can detect diode defects when a value obtained by dividing the pulse width of the negative side pulse $P_R$ by the pulse width of the positive side pulse $P_F$ is larger than a predetermined value.

In FIGS. 7A and 7B, diode defects can be detected by detecting the polarity unbalance of the transformer primary current $I_1$ or by detecting the asymmetry of the load impedance from $P_F/I^1$ and $P_R/I^1$.

Diode defects can also be detected by the unbalance of $P_F$ and $P_R$ under certain conditions.

<Second Embodiment>

The second embodiment will be described below with reference to FIGS. 10 and 11.

Figure 10:
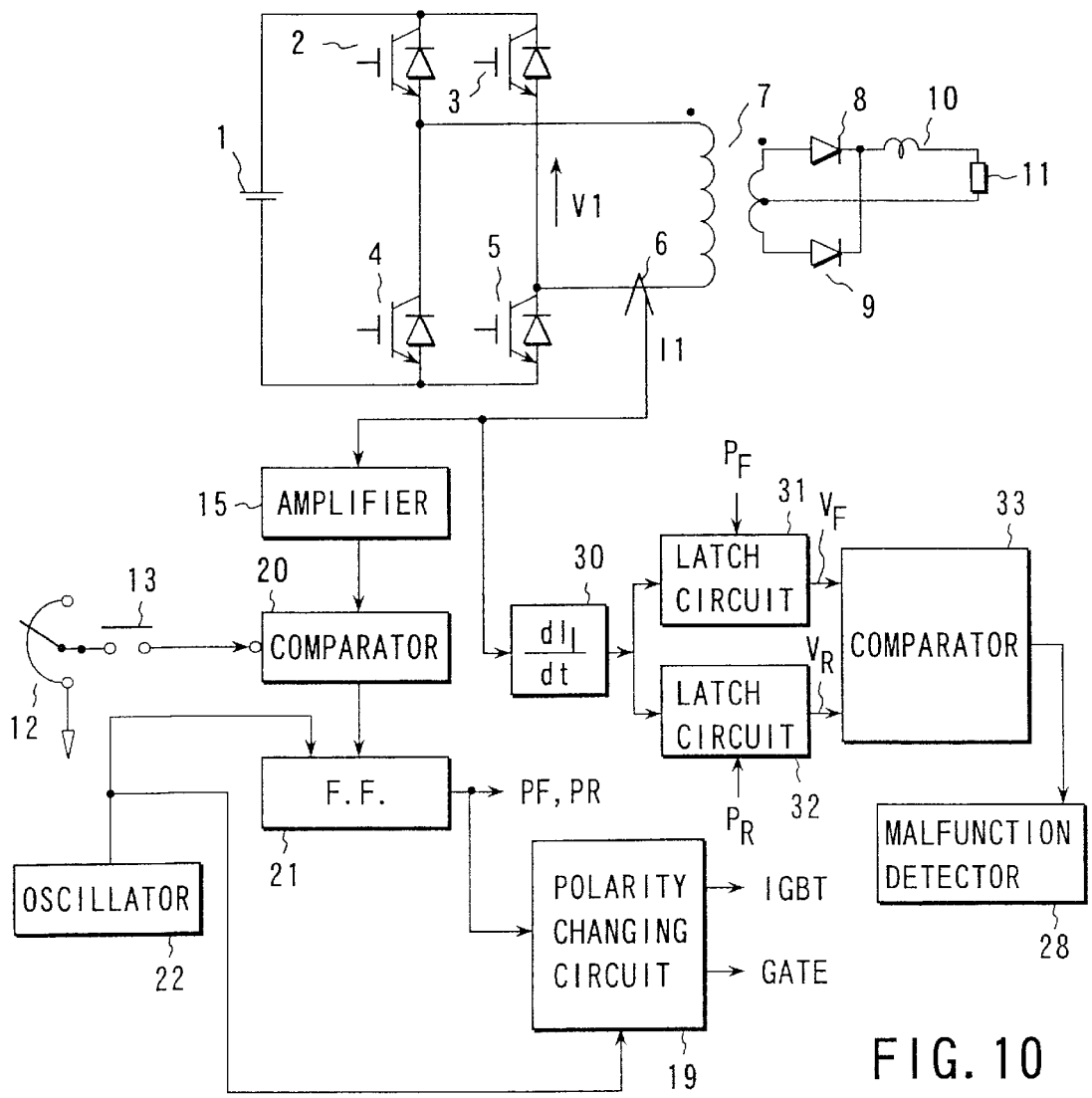
FIG. 10 is a schematic view showing a diode defect detecting device according to the second embodiment of the present invention.

FIG. 10 is a view showing an outline of the arrangement of this second embodiment. The difference from FIG. 3 is that a determination circuit 27 and a current detector are modified as shown in FIG. 10. That is, a differential circuit 30 calculates a current change rate $dI_1/dt$ from a transformer primary current $I_1$. A latch circuit 31 for latching data at the trailing edge of a positive side pulse $P_F$ obtains an output waveform $V_F$.

A latch circuit 32 for latching data at the trailing edge of a negative side pulse $P_R$ obtains an output waveform $V_R$ from the current change rate $dI_1/dt$. A comparator 33 compares these output waveforms $V_F$ and $V_R$. If the difference between the two output waveforms is equal to or larger than a set level, a malfunction detector 28 operates.

The operation of the second embodiment constructed as above will be described below with reference to FIGS. 10 and 11. In FIG. 11, (a) indicates the waveform of the transformer primary current $I_1$, (b); the waveform of the positive side pulse $P_F$, (c); the waveform of the negative side pulse $P_R$, (d); the waveform of the output from the differential circuit 30, (e); the waveform of the output from the latch circuit 31, and (f); the waveform of the output from the latch circuit 32.

Figure 11:
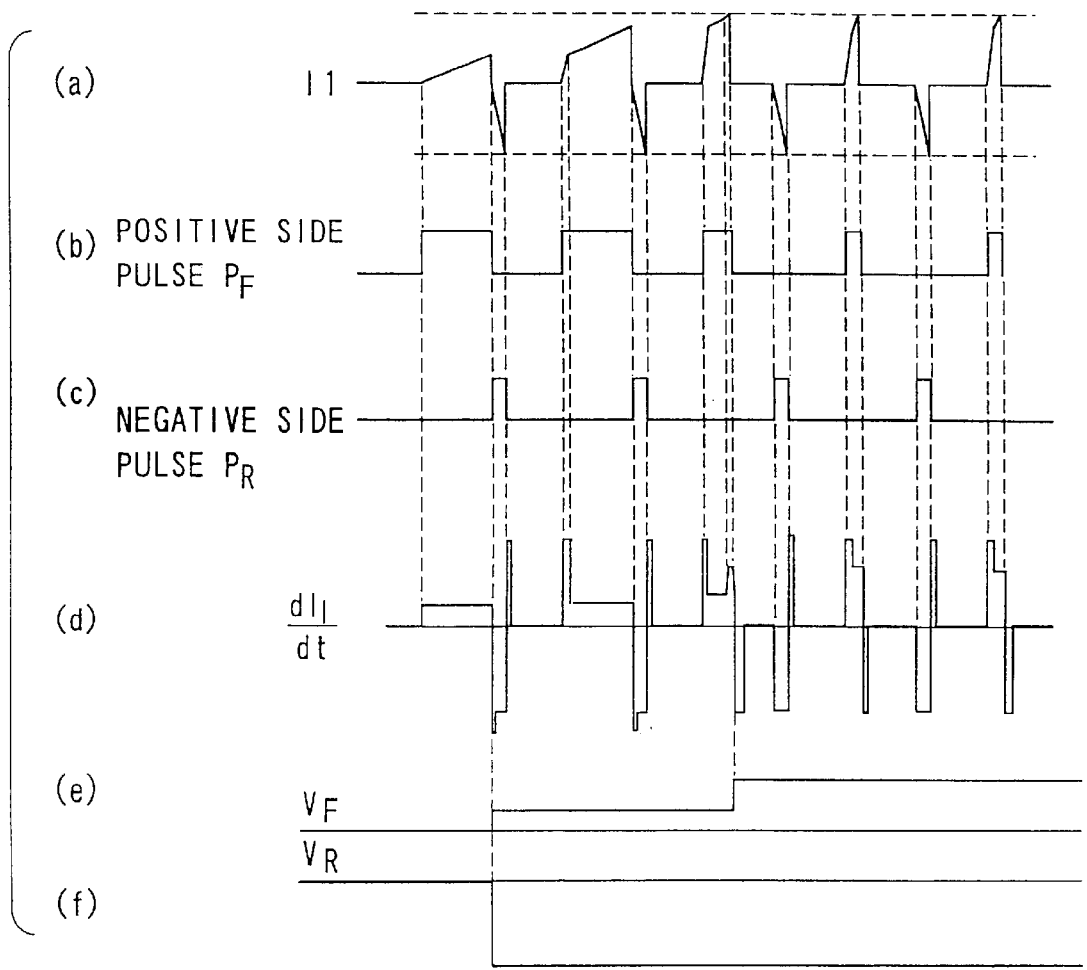
FIG. 11 is a view for explaining the operation of the diode defect detecting device shown in FIG. 10.

Under the conditions shown in FIG. 4A, the transformer primary current $I_1$ changes as shown in (a) shown in FIG. 11, and the $dI_1/dt$ changes as (d) shown in FIG. 11. Therefore, a malfunction is detected by obtaining V and $V_R$ by latching the $dI_1/dt$ at the leading edges of $P_F$ and $P_R$, i.e., immediately before the current is shut off, and comparing these $V_F$ and $V_R$.

When a diode is shorted or a transformer saturates, the $dI_1/dt$ increases and at the same time the magnitudes on the positive and negative sides become different from each other. Hence, a diode malfunction can be found by finding this difference.

Referring to FIG. 10, the output waveforms $V_F$ and Vfrom the latch circuits 31 and 32 are compared. However, it is also possible to find a diode malfunction by comparing the magnitudes of $V_F$ and $V_R$ with a set value and detecting abnormality of the magnitudes.

<Modifications>

In the above embodiments, the diode connection on the secondary side of the transformer 7 is of center tap type. However, the operation is exactly the same even with the use of diodes of full-bridge connection.

Diode short-circuits explained in the above embodiments of course include layer shorts of the transformer.

In the diode defect detecting device of the present invention, the instantaneous value of an inverter output current is controlled. Malfunctions of the secondary diode of the transformer are detected on the basis of the unbalance of the PWM pulse width or the current change rate due to the inverter output polarity, or on the basis of an abnormal reduction of the load impedance obtained by dividing the modulation factor by the current value. Accordingly, switching elements of the inverter are unaffected by stress, so diode defects can be reliably detected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A diode defect detecting device used in a controller in which an inverter converts a direct current into an alternate current and supplies the alternate current to a primary side of a transformer, and a rectifying circuit having a plurality of diodes connected to a secondary side of said transformer rectifies an alternate current induced on the secondary side into a direct current and supplies the direct current to a load, comprising:

a current detector for detecting a primary current of said transformer;

a comparator for comparing the detection current detected by said current detector with a current reference and outputting a reset signal if the detection current is larger than the current reference;

an oscillator for generating a clock signal;

a flip-flop circuit for receiving a set signal based on a front and an end edge of the clock signal generated by said oscillator and receiving the output reset signal from said comparator;

a polarity changing circuit for outputting a polarity changing signal for changing polarities of said plurality of diodes on the basis of the output clock signal from said flip-flop circuit; and a determination circuit for calculating, in order to detect malfunctions of said plurality of diodes, an impedance change on the secondary side viewed from the primary side of said transformer based on a pulse width of each polarity of output clock signal from said flip-flop circuit.

2. A device according to claim 1, wherein said determination circuit calculates the impedance change by using a modulation factor of the pulse width of each polarity and a peak value of the primary current detected by said current detector, thereby detecting a diode malfunction.

3. A device according to claim 1, wherein said determination circuit calculates the impedance change by using a modulation factor of the pulse width of each polarity and the current reference, thereby detecting a diode malfunction.

4. A device according to claim 1, wherein said determination circuit detects a diode malfunction when the modulation factor of the pulse width of each polarity becomes not more than a predetermined value.

5. A device according to claim 1, wherein said determination circuit obtains a pulse width of each polarity during a few cycles after said inverter is started.

6. A device according to claim 1, wherein said determination circuit detects a diode malfunction if a value obtained by dividing a pulse width of one polarity by a pulse width of the other polarity is larger than a predetermined value.

7. A device according to claim 1, further comprising:

an alarm generating circuit for generating alarm when said determination circuit detects a diode malfunction.

8. A device according to claim 1, wherein the pulse width of each polarity is obtained by counting the pulse width of each polarity of the output clock signal from said flip-flop circuit by using a counter.

9. A diode defect detecting device used in a controller in which an inverter converts a direct current into an alternate current and supplies the alternate current to a primary side of a transformer, and a rectifying circuit having a plurality of diodes connected to a secondary side of said transformer rectifies an alternate current induced on the secondary side into a direct current and supplies the direct current to a load, comprising:

a current detector for detecting a primary current of said transformer;

a comparator for comparing the detection current detected by said current detector with a current reference and outputting a reset signal if the detection current is larger than the current reference;

an oscillator for generating a clock signal;

a flip-flop circuit for receiving a set signal on the basis of a front and an end edge of the clock signal generated by said oscillator and receiving the output reset signal from said comparator;

a polarity changing circuit for outputting a polarity changing signal for changing polarities of said plurality of diodes on the basis of the output clock signal from said flip-flop circuit;

a current change rate detector for detecting a change rate of the primary current of said transformer;

a first latch circuit for latching the current change rate detected by said current change rate detector at an input timing of an end edge of a positive side clock signal of the clock signal of each polarity output from said flip-flop circuit;

a second latch circuit for latching the current change rate detected by said current change rate detector at an input timing of an end edge of a negative side clock signal of the clock signal of each polarity output from said flip-flop circuit; and a circuit for detecting malfunctions of said plurality of diodes if a difference between the current change rates latched by said first and second latch circuits is not less than a predetermined value.

* * * * *